US012663393B2

(12) United States Patent
Huang et al.

(10) Patent No.: US 12,663,393 B2
(45) Date of Patent: Jun. 23, 2026

(54) pH SENSOR MEASUREMENT

(71) Applicant: Georg Fischer Signet LLC, Irwindale, CA (US)

(72) Inventors: Jun Huang, Rowland Heights, CA (US); Calin Ciobanu, Brea, CA (US); Geordon Alexander Worley, Austin, TX (US); Jerome Brent Ford, Placentia, CA (US)

(73) Assignee: Georg Fischer Signet LLC, Irwindale, CA (US)

( * ) Notice: Subject to any disclaimer, the term of this patent is extended or adjusted under 35 U.S.C. 154(b) by 259 days.

(21) Appl. No.: 18/397,428

(22) Filed: Dec. 27, 2023

(65) Prior Publication Data

US 2025/0216351 A1     Jul. 3, 2025

(51) Int. Cl.
*G01N 27/02*      (2006.01)
*G01N 27/30*      (2006.01)
*G01N 27/416*     (2006.01)
*G01R 27/02*      (2006.01)

(52) U.S. Cl.
CPC ........... *G01N 27/02* (2013.01); *G01N 27/302* (2013.01); *G01N 27/4165* (2013.01); *G01R 27/02* (2013.01)

(58) Field of Classification Search
CPC .. G01N 27/02; G01N 27/4165; G01N 27/302; G01R 27/02
See application file for complete search history.

(56) References Cited

U.S. PATENT DOCUMENTS

| | | | |
|---|---|---|---|
| 4,536,274 A | 8/1985 | Papadakis et al. | |
| 4,808,930 A | 2/1989 | Kaiser | |
| 8,063,644 B2 | 11/2011 | Rezvani et al. | |
| 9,488,611 B2 | 11/2016 | Rezvani et al. | |
| 2002/0027085 A1* | 3/2002 | Stori | G01N 27/286 |
| | | | 205/775 |

FOREIGN PATENT DOCUMENTS

EP            0419769 A2     4/1991

* cited by examiner

*Primary Examiner* — Amy He
(74) *Attorney, Agent, or Firm* — Harness, Dickey & Pierce, P.L.C.

(57) ABSTRACT

A method is provided for measuring the impedance of a pH sensor electrode. The method includes applying a positive voltage pulse to the pH electrode and taking a plurality of samples of the sensor voltage response and, from those samples, estimating the impedance of the sensor electrode. Then, a negative voltage pulse width is dynamically adjusted to cancel out the induced charges from the positive voltage on the pH sensor so that the sensor quickly recovers to read subsequent media pH levels.

7 Claims, 6 Drawing Sheets

Wires to pH Meter

Filling Hole

Ag/AgCl Reference Electrode

Reference Electrode Internal Solution

Junction

Ag/AgCl Covered Glass Electrode

Internal Solution

Wires to pH Meter

Filling Hole

Ag/AgCl
Reference Electrode

Reference Electrode
Internal Solution

Junction

Ag/AgCl Covered
Glass Electrode

Internal Solution

Volts
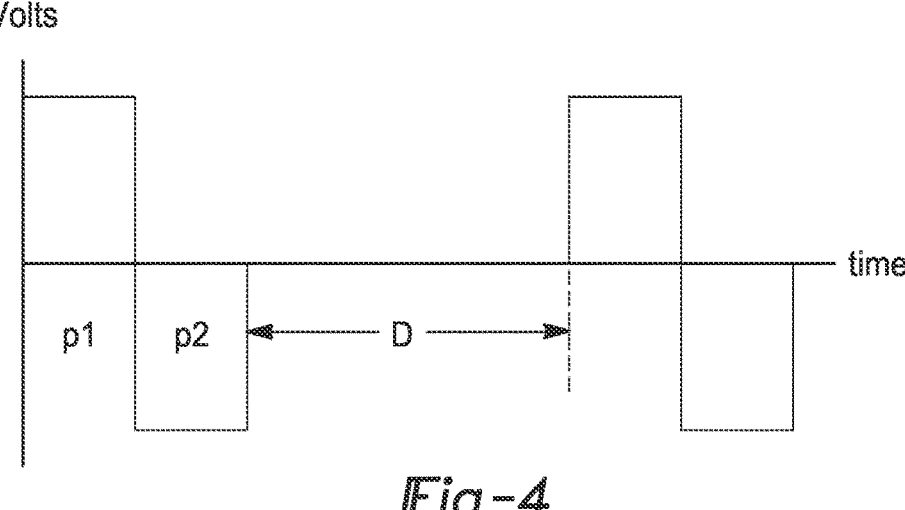
_Fig-4_
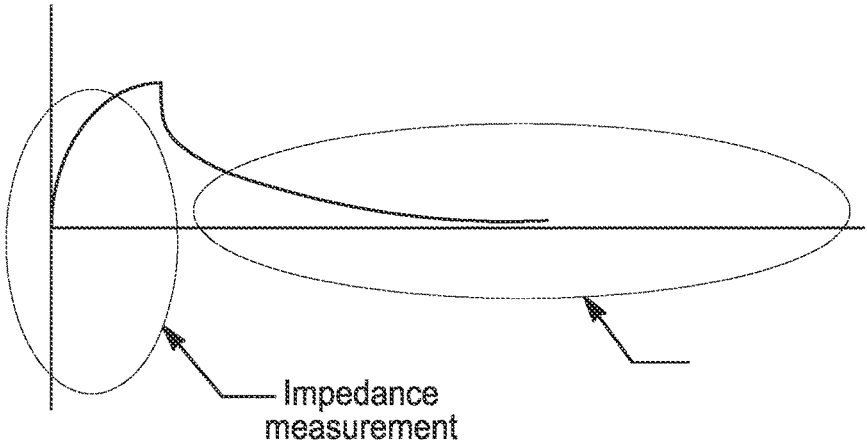
Impedance measurement
_Fig-5_
Volts
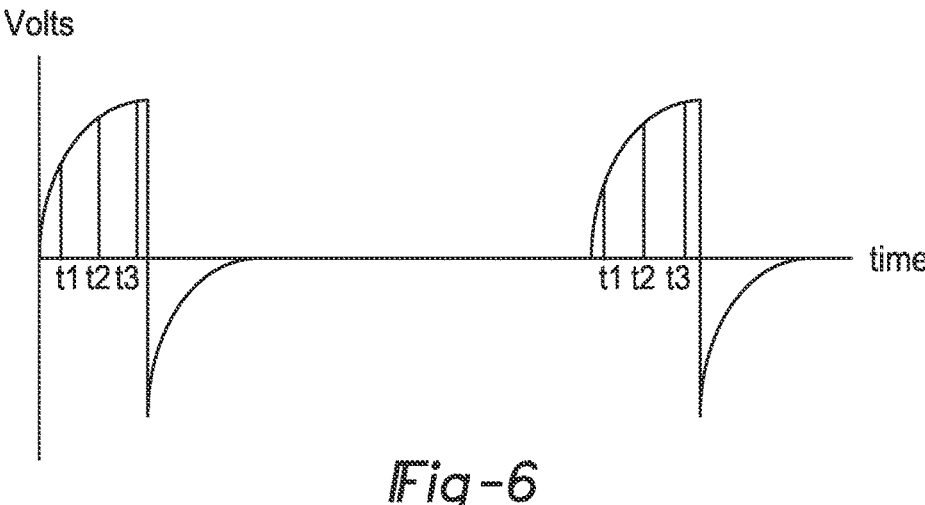
_Fig-6_ pH SENSOR MEASUREMENT

FIELD

The present disclosure relates to pH sensors and, more particularly, to techniques for measuring the impedance of a glass pH sensor electrode.

BACKGROUND

The term pH represents the quantitative measure of the acidity or basicity of aqueous or other liquid solutions. The term, $pH=-\log [H+]$, translates the values of the concentration of the hydrogen ion—which ordinarily ranges between about 1 and $10^{-14}$ gram-equivalents per litre—into numbers between 0 and 14. In pure water, which is neutral (neither acidic nor alkaline), the concentration of the hydrogen ion is $10^{-7}$ gram-equivalents per litre, which corresponds to a pH of 7. A solution with a pH less than 7 is considered acidic; a solution with a pH greater than 7 is considered basic, or alkaline.

A probe capable of measuring pH, consists of two electrodes: a sensor electrode, also known as glass electrode embedded in a special formulation glass and a reference electrode. The ion exchange generates a voltage. Ion exchange occurs on the inner surface of the glass electrode. Since the acidity of the potassium chloride inside the electrode and the solution being measured are different, the activity of the hydrogen ions will be different, resulting in a difference in charge. When this happens, a potential difference occurs between the sides of the glass electrode and the reference electrode, which is proportional with the acidity or alkalinity level of the media solution. For each 1 pH change, the potential also known as Slope changes by 59.16 mV. The Reference is kept at an ideal zero potential. The potential difference between the two electrodes is measured and converted into pH level readings.

Because the potential difference to be measured is generated across the pH Glass, special measures have to be taken to properly measure the voltage, all due to the high Glass Impedance which ranges from 50 MOhm to 500 MOhm at 25 C.

When Temperature gets below 250, the Glass Impedance increases and it decreases when temperature increases.

The quality of the pH measurement strongly depends on the condition of the glass.

The pH electrodes age which can result in changes to the electrical characteristics of electrode over time or during harsh application or environment. Electrode aging causes an increase of glass/reference impedance, measurement response time, a declining voltage-to-pH slope, especially in the alkaline region, and/or a shift of the asymmetry potential. As an electrode deteriorates, the ability of the probe to accurately measure pH also deteriorates resulting inaccurate and/or inconsistent pH level measurements.

The glass electrode impedance increase can be indicative of changes in the chemical composition of the membrane glass, steady growth of the internal membrane gel layer, or mechanically induced damage of the outer gel layer of the membrane during measurement and cleaning. When the Glass breaks, the pH measurement is compromised.

For all of the above, being able to measure the glass impedance becomes a good practice for a reliable pH measurement. U.S. Pat. No. 9,488,611 to Rezvani et al discloses a method for detecting the impedance of a pH electrode.

SUMMARY

A method is provided for measuring the impedance of a pH sensor electrode. The method includes applying a positive voltage pulse to the pH electrode and taking a plurality of equally timed samples of the sensor voltage response and, from those samples, estimating the impedance of the electrode. Then, a negative voltage pulse width is applied to cancel out the induced charges from the positive voltage on the pH sensor so that the sensor quickly recovers to read media pH levels.

These and various other features and advantages will be apparent from a reading of the following Detailed Description using the exemplary embodiment therein described. This Summary and Abstract are not intended to identify key features or essential features of the claimed subject matter, nor are they intended to be used as an aid in determining the scope of the claimed subject matter. The claimed subject matter is not limited to implementations that solve any or all disadvantages noted in the background.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

FIG. 4 is a pulse diagram;

FIG. 5 is a waveform illustrating a delay that may be encountered in a typical pH measurement techniques;

FIG. 6 is a voltage versus time waveform during measurement according to the preferred embodiment of this invention;

DESCRIPTION OF THE PREFERRED EMBODIMENTS

Figure 1:
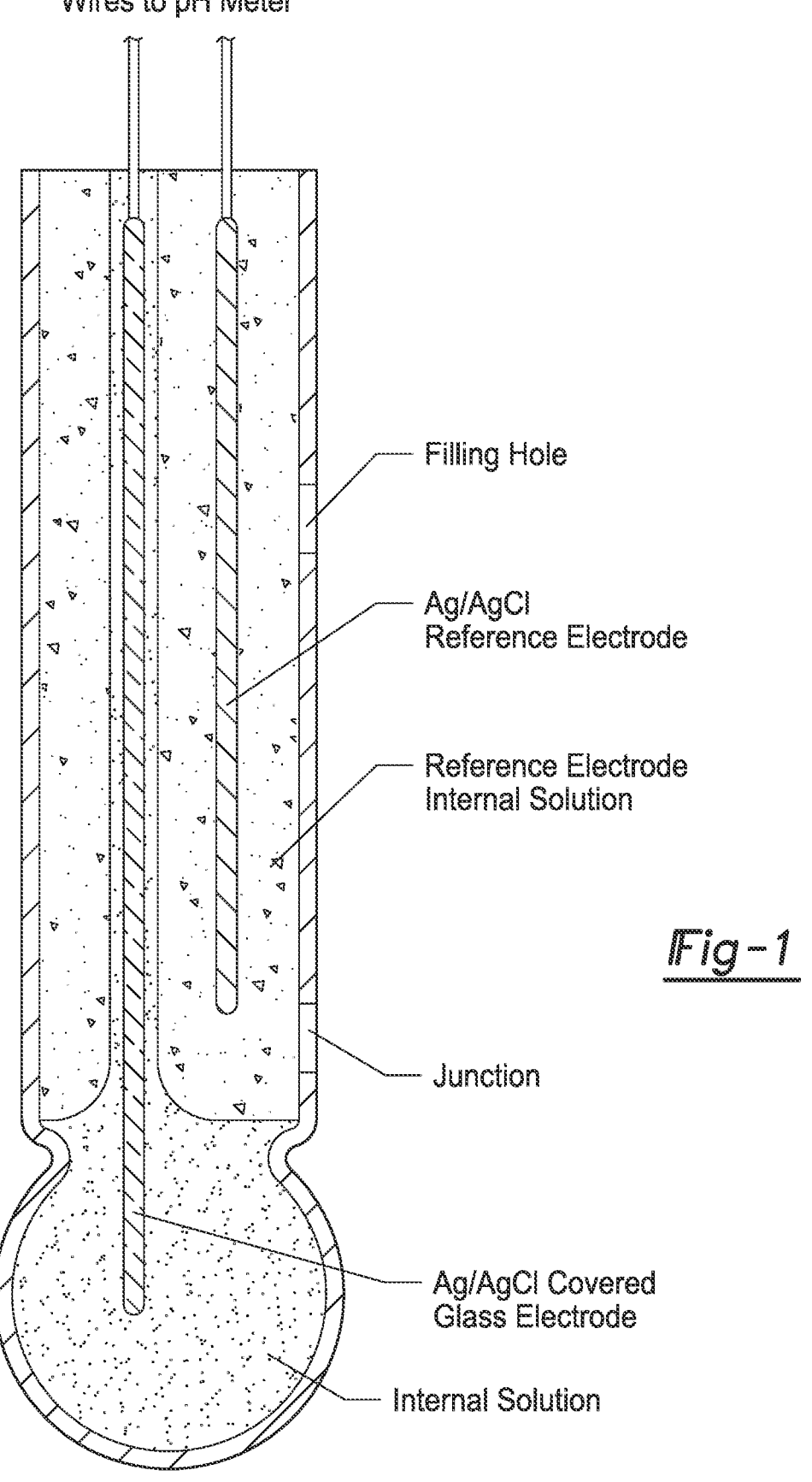
FIG. 1 shows an example of a pH sensor probe having a pH glass electrode whose pH value can be measured.
Figure 2:
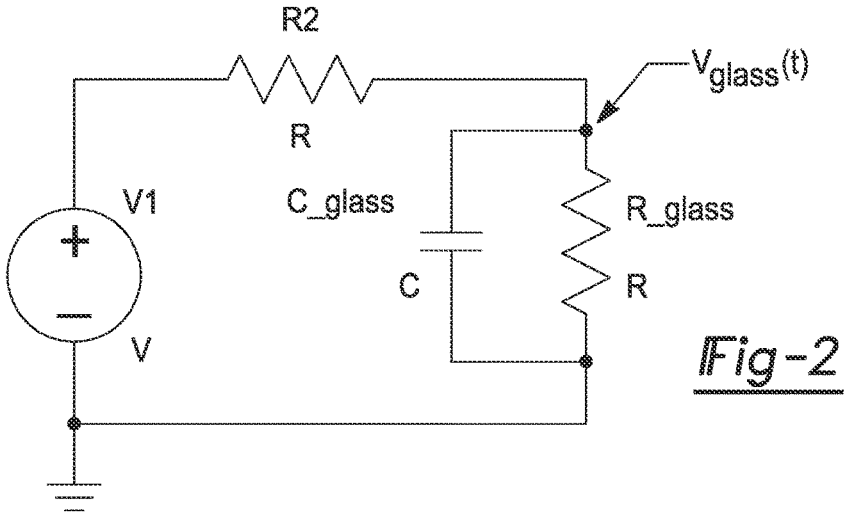
FIG. 2 is an electrical circuit model.

Referring now to FIG. 2, a pH probe electrical model of probes similar to that shown in FIG. 1, is similar to a High Value Resistor (50M to 500M) and a Parallel Capacitor.

To measure the R_glass a voltage source (V1) and a fixed divider (R2) are provided.

The voltage across the pH probe can be solved by the following formula:

$$V_{glass}(t) = \frac{V_1}{\frac{R_2 + R_{glass}}{R_{glass}}} \left[ 1 - \frac{\exp\left(-\frac{R_2 + R_{glass}}{R_{glass}} * t\right)}{R2 * C1} \right] \qquad \text{Equation 1}$$

To further simplify the equation:

Let $\alpha = \dfrac{R_2 + R_{glass}}{R_{glass}}$, which is unitless ratio

Equation 1 can be simplified to the following equation:

$$V_{glass}(t) = \frac{V_1}{\alpha} \left[ 1 - \frac{\exp(-\alpha * t)}{R2 * C1} \right] \qquad \text{Equation 2}$$

Now Equation 2 is same as the standard exponential growth equation as below:

$$y(t) = a\left[1 - \exp(-b * t + c)\right] \qquad \text{Equation 3}$$

Equation 3 can be further simplified to:

$$y(t) = g + h * \exp(-b * t) \qquad \text{Equation 4}$$

where $g = a$, $h = -a * \exp(c)$

Figure 9:
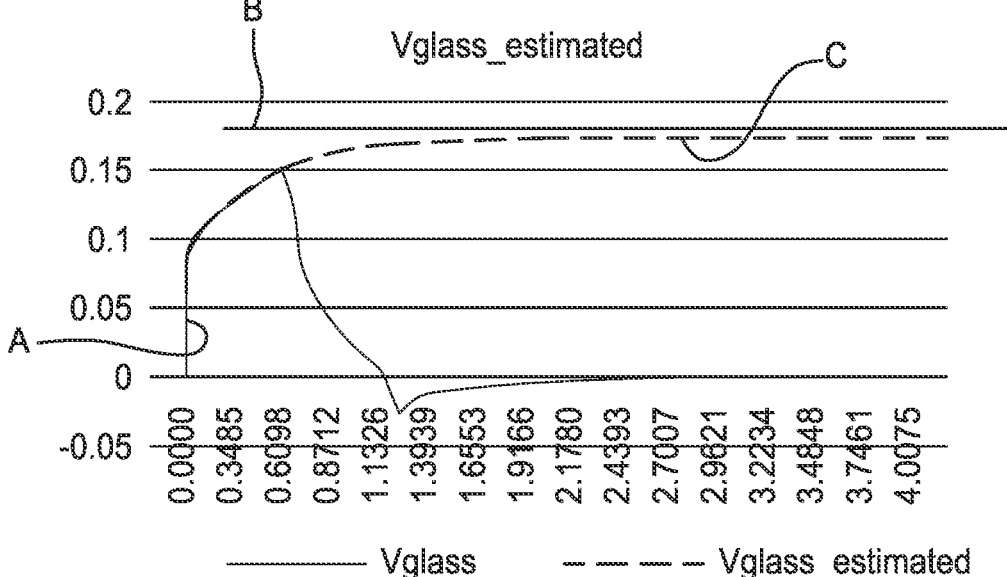
FIG. 9 is a voltage versus time waveform of the pH glass electrode during measurement illustrating the estimated measurement voltage according to the teachings of the present invention.

Take 3 samples from $y(t)$ data points before asymptote section B (FIG. 9)

$$r = \frac{y(t2) - y(t1)}{y(t3) - y(t2)} \qquad \text{Equation 5}$$

$y(t1)$, $y(t2)$, $y(t3)$, where $t3 - t2 = t2 - t1$ $$b = \frac{\ln(r)}{t2 - t1} \qquad \text{Equation 6}$$

Now solve for $h$ using $y(t) = g + h * \exp(-b * t)$ with any two even timed samples, then solve for $g$ and $c$.

$$c = \ln\left(\frac{-h}{g}\right) \qquad \text{Equation 7}$$

Now steady state of $y(t) = a[1 - \exp(-b * t + c)]$ can be estimated by entering a long time constant in "t".

Figure 3:
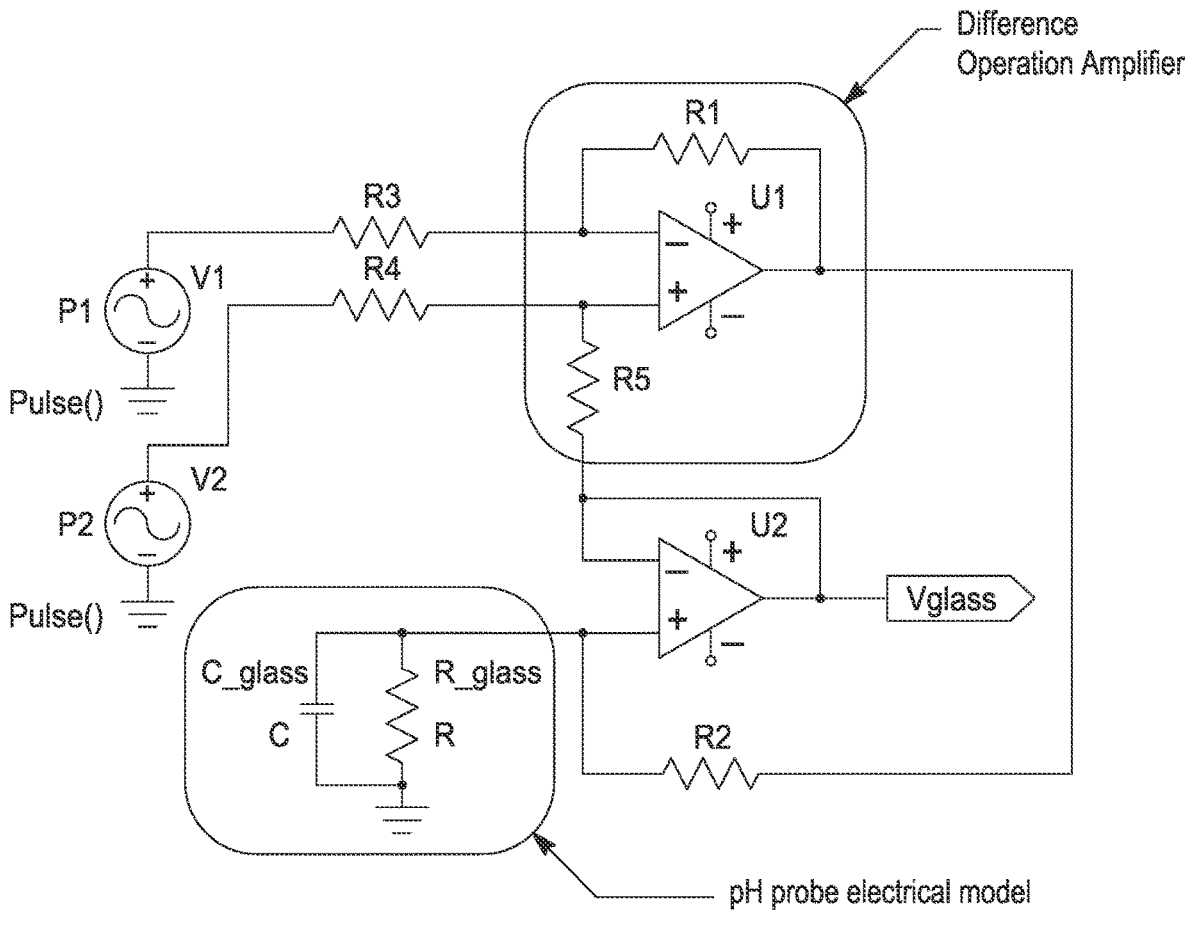
FIG. 3 is an electrical circuit for measuring glass impedance of a pH electrode.

Circuit Concept:

Voltage source (V1) in FIG. 3 is designed with a Difference Operational Amplifier (U1) so that it can generate bi-polar pulses. Another operation amplifier (U2) is used as a buffer for signal conditioning of the pH input. As shown in FIG. 3 bipolar pulses (p1 and p2) are sent to the pH probe. Being applied alternating, the pulses are applied on the two sides of the glass. The positive pulse is used for glass impedance measurement while the negative pulse is used to cancel the positive charge induced on the pH probe during glass impedance measurement so the pH reading can be quickly recovered. The amplitude of the pulses is controlled for a minimal remnant energy in the glass for a minimal pH mV level measurement. The glass impedance measurement cycle is applied with a predetermined time pattern (D).

As illustrated in FIG. 4 because of the capacitive component of the glass, the pH reading is not immediately accurate because the probe will take substantial amount of time returning to the correct pH measurement if no negative is applied to the probe. Therefore, the implementation of applying negative pulse (p2) is provided. Also, the pulse width of p2 is dynamically adjusted by logic device at different operating conditions.

A logic device such as a controller integrates the total energy of the electrode voltage response after sending pulse P1, then sends a negative pulse (P2) with a width adjusted by the logic device adjusted such to match the energy induced by the positive pulse P1. The width is determined by total energy of the electrode voltage response divided by the voltage amplitude of P1. The total energy of the probe response can vary at different operating conditions, so the negative pulse width is adjusted accordingly.

As illustrated in FIG. 6, three $V_{glass}$ samples are carefully picked from the curve, and they are evenly spread out in time as shown. By applying the three samples in Equations from 5-7, the steady state of $V_{glass}$ is accurately estimated.

Since the values of $V_1$ and $R_1$ (FIG. 1) are already know, the probe impedance can be solved with Formula 1 below:

$$Rglass = \frac{Vglass}{(V_1 - Vglass)/R_2} \qquad \text{Formula 1}$$

Formula 1 is further expanded to Formula 2 since $V_1$ is replaced with Difference Operation Amplifier and the addition of U2 in Circuit 2.

$$Rglass = \frac{Vglass + V_{diff}}{V_{diff}} * R_2 - R_2 \qquad \text{Formula 2}$$

Where:

$$V_{diff} = \frac{V_1 * R_1}{R_3}; R_1 = R_5, R_3 = R_4$$

(Note: $V_{diff}$ is the output generated by the Difference Operation Amplifier)

Figure 7:
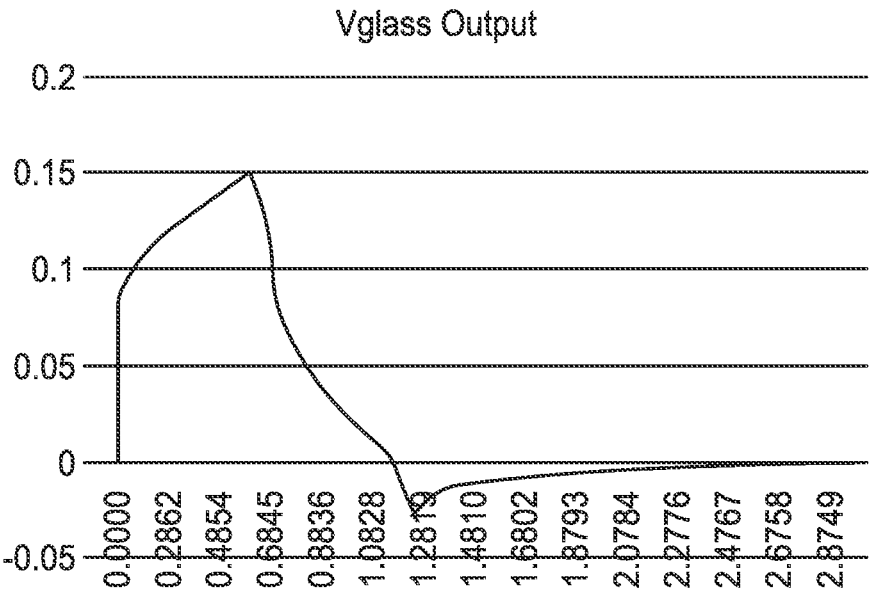
FIG. 7 is a voltage versus time waveform of the pH glass electrode during measurement.

Actual Calculation:

The graph in FIG. 7 is the probe glass impedance output voltages when the pulse are applied from the actual circuit (FIG. 3). Three even-timed samples are used in the calculation, 0.09090465 volts at 0.1245 seconds, 0.125465114 volts at 0.3485 seconds, 0.14543876 volts at 0.5725 seconds. Using Equations 5 and 6:

$$r = \frac{y(t2) - y(t1)}{y(t3) - y(t2)} = 1.73030177$$

$$b = \frac{\ln(r)}{t2 - t1} = \frac{\ln(1.73030177)}{0.3485 - 0.1245} = 2.447519293$$

Using substitution method in Equation 4, h can be solved:

$y(t3) = g + h * \exp(-b * t3);$ $0.14543876 = g + h * \exp(-2.447519293 * 0.5725)$ $y(t2) = g + h * \exp(-b * t2);$ $0.125465114 = g + h * \exp(-2.447519293 * 0.3485)$ -continued $$h = -0.111042361$$

Re-arrange Equation 4, g can be solved with any one of the three samples. Sample 2 is used in this calculation;

$$g = y(t) - h * \exp(-b * t) = 0.125465114 -$$
$$(-0.111042361 * \exp(-2.447519293 * 0.3485) = 0.17278856$$

Using Equation 7, c can be solved:

$$c = \ln\left(\frac{-h}{g}\right) = \ln\left(\frac{0.111042361}{0.17278856}\right) = -0.442156893$$

Figure 8:
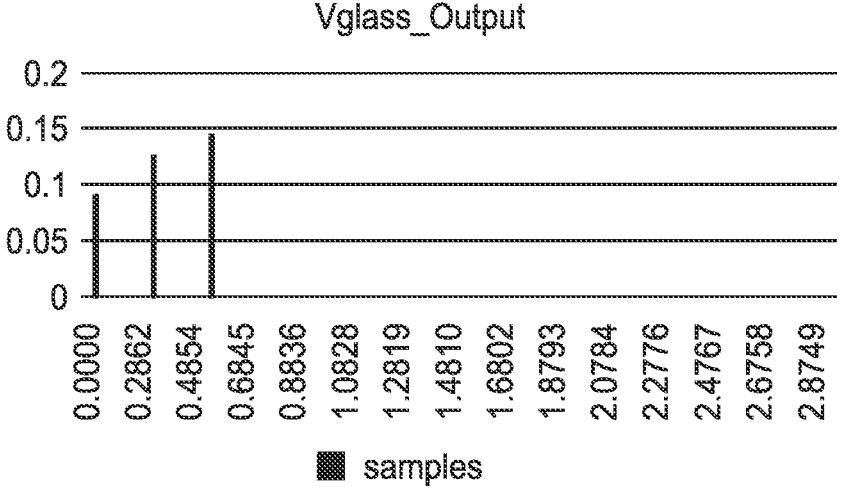
FIG. 8 is a voltage versus time waveform of the pH glass electrode during measurement.

Now steady state of y(t)=g[1−exp(−b*t+c)]=0.17278856 [1−exp(−2.447519293*t−0.442156893)] can plotted in FIG. 8.

Figure 10:
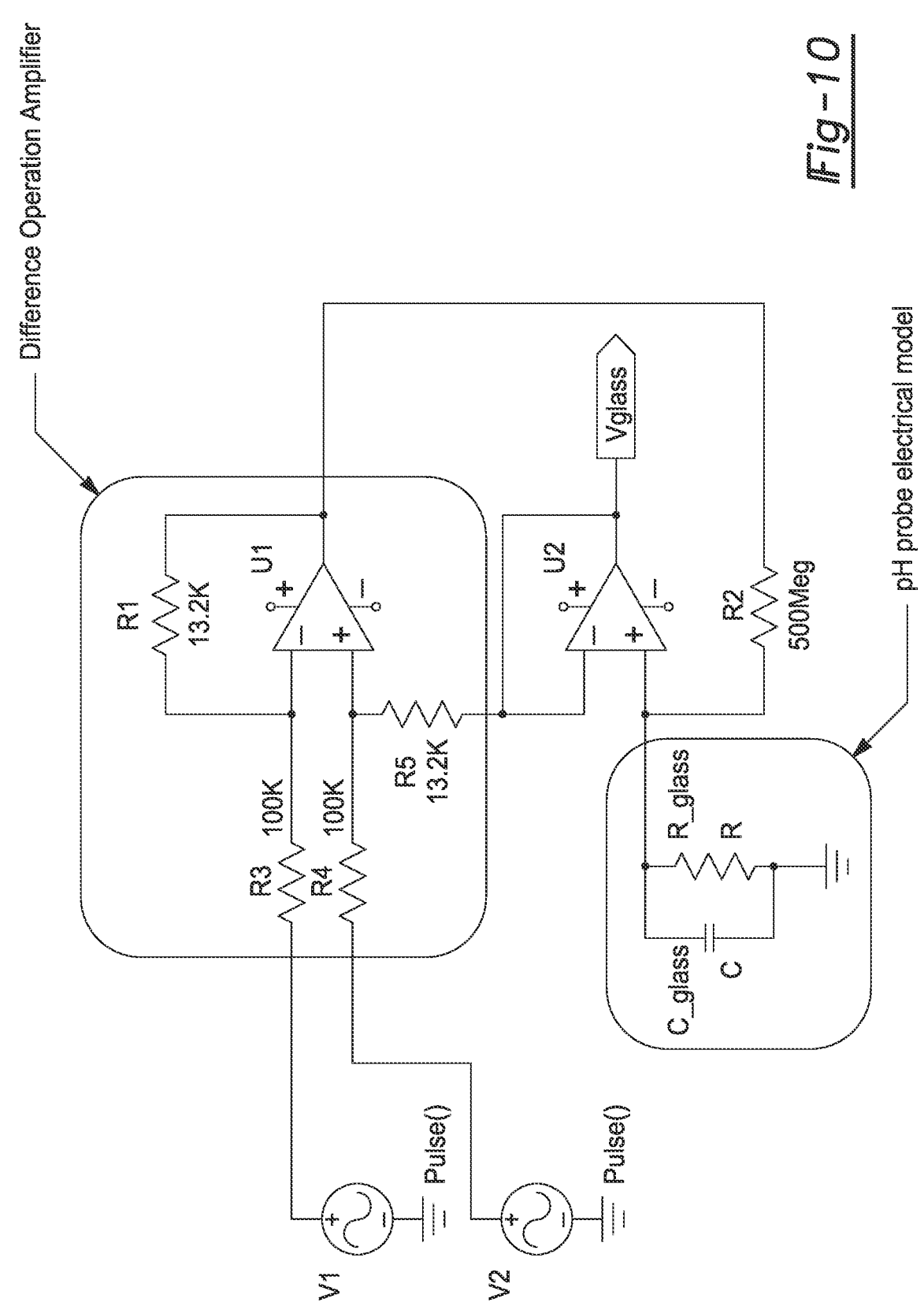
FIG. 10 is a circuit diagram employed in the method of the present invention.

The output of the Diff Amp in FIG. 10 (which is similar to FIG. 3 with values added)

$$V_{diff} = \frac{V_1 * R_1}{R_3} = \frac{1.4505 \text{ V} * 13.2 \text{ K}}{100 \text{ K}} = 0.191472527 \text{ Volts}$$

Probe impedance can be solve using $$Rglass = \frac{Vglass + V_{diff}}{V_{diff}} * R_2 - R_2 =$$
$$\frac{0.17278392 + 0.191472527}{0.191472527} * 500Meg - 500Meg = 451.2 \text{ } Meg$$

To summarize and in reference particularly to FIG. 9, the method of the present invention is capable of considerably shortening the time frame for determining the pH of a glass electrode in a pH sensing probe. Instead of waiting for the electrode voltage response to reach steady state such as point C in FIG. 9 (which can take up to 30 seconds), the present invention takes three equally timed samples before the electrode voltage response reaches asymptote as represented by the line B. The electrode voltage response is shown by the solid line A in FIG. 9. From these samples the pH of the glass electrode is estimated very quickly, generally less than 250 ms. Then, a negative voltage pulse is applied to cancel out induced charges from the positive voltage on the electrode so that the electrode quickly recovers to read subsequent media pH levels.

The present invention shows an improved method of measuring the pH probe's Glass Impedance by using least squared fitting to inverse exponential function. Some of the improvements are:

The pulses are applied at the current-contemporaneous value of the electrode pH raw mV value measurement; hence the only disturbing energy consists of the pulses applied to the glass which is significantly lower than if it would have been applied in reference to zero, ground mV level.

The method applies a consistent way of pulsing the glass with predetermined timing, hence the measurement becomes reliable.

By applying a RC level predicted value, the method takes a very small amount of time (200 msec) when compared to the 10-30 sec necessary for the electrode voltage response to reach the final value, therefore sacrifice pH measuring time is not sacrificed. This way the affliction on the run time pH measurement is reduced to the 1-2 sec compared to the 10-30 seconds.

To even more reduce the Glass Recovery Time and return to pH normal measurement, an opposite energy (applied from the other side of the glass) will help to even more reduce the recovery time. This reversed energy pulse will be calculated using the integrated positive pulse's energy.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for measuring the impedance of a pH sensor electrode comprising:

applying a positive voltage pulse to the pH electrode;

taking a plurality of samples of the electrode voltage response to the positive pulse, the samples being equally timed from each other during application of the positive pulse;

from those samples, estimating the impedance of the electrode;

applying a negative voltage pulse to cancel out induced charges from the positive voltage on the electrode so that the electrode quickly recovers to read media pH levels; and wherein the negative pulse is dynamically adjusted as a function of the electrode voltage response.

2. The method of claim 1 wherein the samples are taken within less than 250 ms of the beginning of the positive pulse.

3. The method of claim 2 wherein three samples are taken equally spaced apart in time.

4. The method of claim 3 wherein the three samples are taken before the asymptote of a curve of the electrode voltage response.

5. The method of claim 1 wherein the width of the negative pulse is dynamically adjusted.

6. The method of claim 5 wherein the width of the negative pulse is dynamically adjusted by:

determining the energy of the electrode voltage response after applying the positive pulse; and generating a negative pulse that substantially matches the total energy of the electrode voltage response.

7. The method of claim 6 wherein of the pulse width of the negative pulse is determined by the total energy of the electrode voltage Response divided by the voltage amplitude of the positive pulse.

* * * * *